(12) United States Patent
Paul et al.

(10) Patent No.: US 8,581,637 B2
(45) Date of Patent: Nov. 12, 2013

(54) LOW-POWER, LOW-LATENCY POWER-GATE APPARATUS AND METHOD

(75) Inventors: Suganth Paul, Austin, TX (US); Jhonny Anthonio Wong, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 218 days.

(21) Appl. No.: 13/172,788

(22) Filed: Jun. 29, 2011

(65) Prior Publication Data

US 2013/0002339 A1 Jan. 3, 2013

(51) Int. Cl.
*H03K 3/00* (2006.01)
(52) U.S. Cl.
USPC ............ 327/108; 327/535; 323/908; 323/222
(58) Field of Classification Search
USPC ............................ 323/908, 222; 327/108, 535
See application file for complete search history.

(56) References Cited

U.S. PATENT DOCUMENTS

| 5,629,609 A * | 5/1997 | Nguyen et al. ................ 323/269 |
| 7,683,592 B2 * | 3/2010 | Soude et al. .................. 323/275 |
| 7,944,284 B2 * | 5/2011 | Blair ............................ 327/540 |
| 2003/0111985 A1 * | 6/2003 | Xi ................................. 323/273 |
| 2010/0321090 A1 * | 12/2010 | Blair ............................ 327/434 |

* cited by examiner

*Primary Examiner* — Ryan Jager
(74) *Attorney, Agent, or Firm* — Schwabe, Williamson & Wyatt, P.C.

(57) ABSTRACT

A low-power, low-latency power-gate (LPLLPG) circuit is used to shut off or otherwise reduce power that is provided to electronic component(s), such as in a sleep or standby mode. ON-rush current is controlled by sizing at least one transistor in the power-gate circuit, and power consumption of the power-gate circuit in both standby state and active state is reduced by not using additional delay elements. Ramping up a gated voltage supply with low ON-rush current is performed by applying/using logic rather than delay signals. This logic does not turn ON transistors in the power-gate circuit until the gated voltage supply has ramped up close to a level of an ungated voltage supply. By not using additional delay cells, faster turn OFF of the gated voltage supply is obtained.

16 Claims, 5 Drawing Sheets

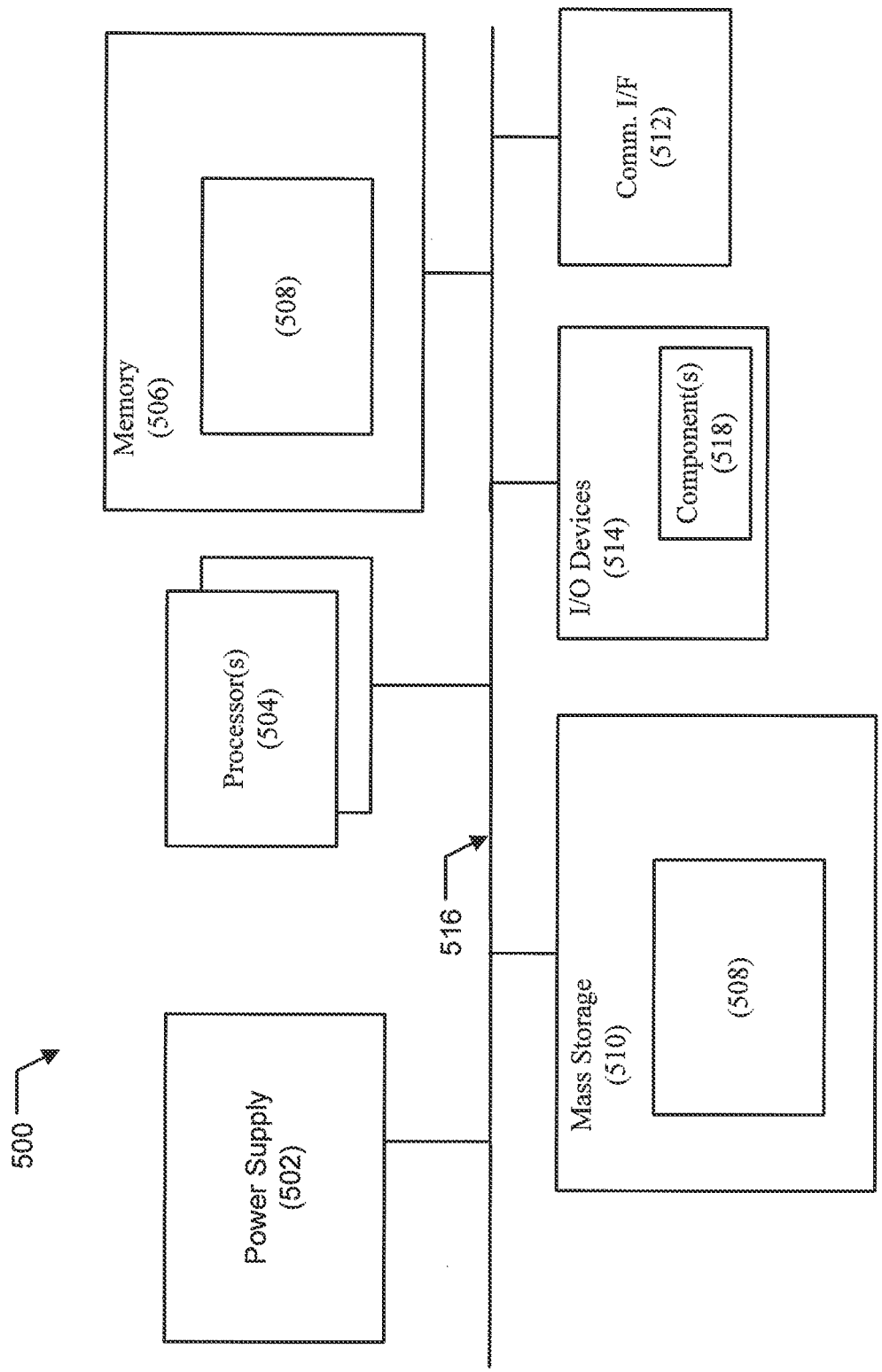

LOW-POWER, LOW-LATENCY POWER-GATE APPARATUS AND METHOD

TECHNICAL FIELD

This disclosure relates generally to electronic circuits. More particularly but not exclusively, the present disclosure relates to a power-gate circuit.

BACKGROUND INFORMATION

Power-gating techniques generally involve shutting off or reducing power that is supplied to certain electronic circuit component(s) when such electronic component(s) are not in use, such as in a sleep or standby mode.

Controlling the ON-rush current is one of the challenges with power-gating techniques. For example, some electronic components may not be able to tolerate short-term spikes/increases in supplied current—this high current can become a significant detrimental issue when a power-gate circuit turns ON the power supply to such electronic components, when there may be an initial high level of ON-rush current before the supplied current reaches a lower steady state level.

To address the ON-rush current, conventional power-gate methods/circuits provide dedicated additional delay elements. The delay elements operate to provide a delay for a supplied voltage to ramp up from a lower level to a higher (such as close to or approximately equal to a full operating) level. While the delayed ramping up of the supplied voltage may attempt to address the issue of high ON-rush current, the additional delay cells contribute to power consumption during both active and sleep/standby modes. Furthermore, the additional delay cells slow down the turn OFF speed of the conventional power-gate circuit, such that there is some amount of power consumption during the turn OFF process before the power-gating circuit is able to reduce power to the electronic component(s).

BRIEF DESCRIPTION OF THE DRAWINGS

Non-limiting and non-exhaustive embodiments are described with reference to the following figures, wherein like reference numerals refer to like parts throughout the various views unless otherwise specified.

FIG. 5 is a block diagram that illustrates an example computer system suitable to practice the disclosed power-gate circuit/method of various embodiments.

DETAILED DESCRIPTION

Figure 1:
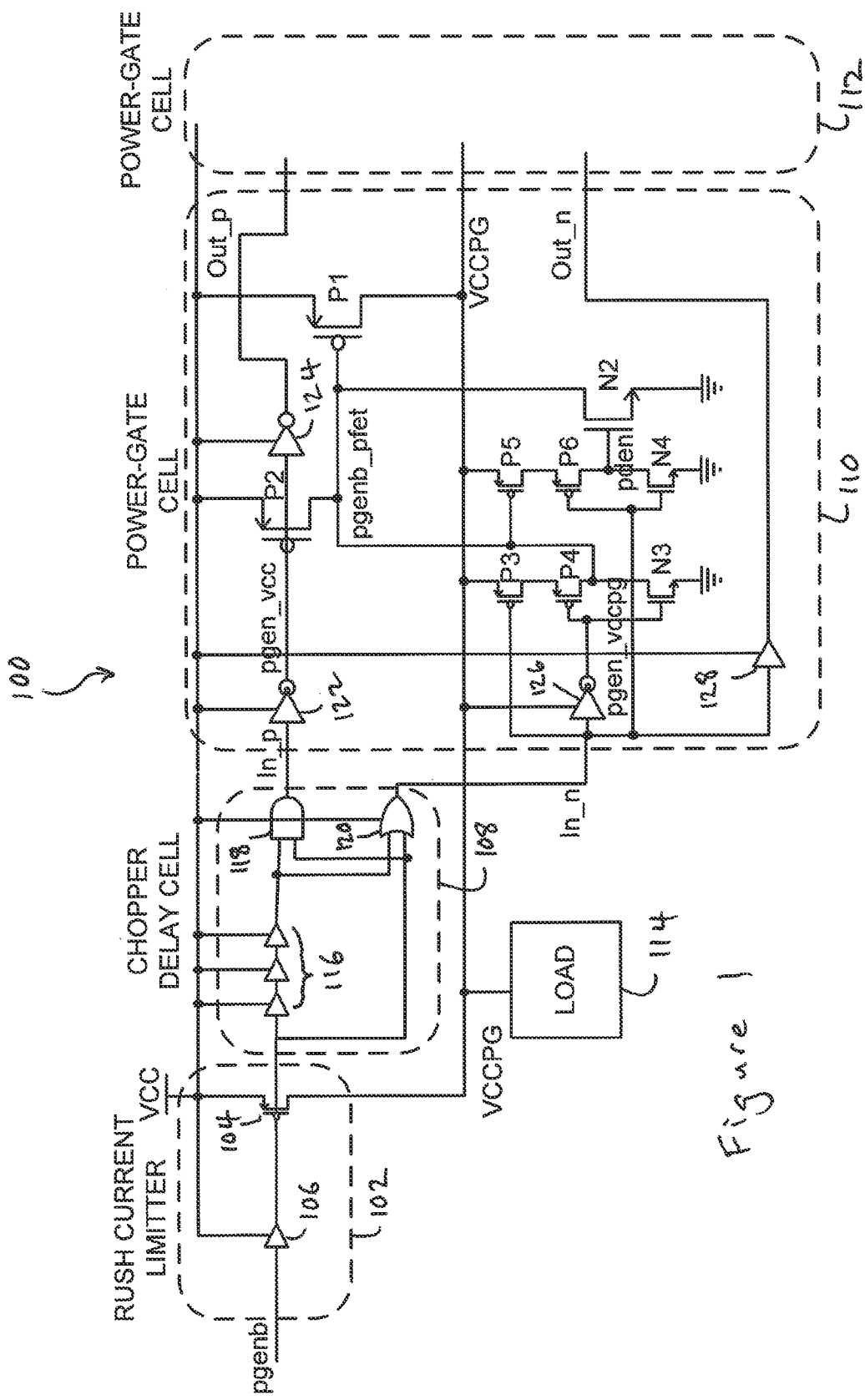
FIG. 1 illustrates a power-gate circuit in accordance with one embodiment.

Embodiments of a method and apparatus to provide power-gating capability are described herein. In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

One embodiment provides a low-power, low-latency power-gate (LPLLPG) circuit that may be used to shut off or otherwise reduce power that is provided to electronic component(s). The electronic component(s) may comprise a load, a section of circuit on a portion of an integrated circuit, or other electronic component(s) that may be supplied with power and that are present in a system that would operate more optimally by having the power supplied to such electronic component(s) shut off or otherwise reduced while in certain modes, such as a sleep or standby mode.

According to one embodiment, the ON-rush current may be controlled by appropriately sizing at least one transistor in the power-gate circuit, whereas in the conventional approach described above, controlling the ON-rush current is performed by using a number of additional delay elements. Power consumption of the power-gate circuit in both standby state and active state may be reduced in one embodiment by not using such additional delay elements.

According to one embodiment during turn ON, the delay in ramping up a gated voltage supply (referred to herein as a voltage supply VCCPG) with low ON-rush current is generated by applying/using logic on the voltage supply VCCPG. This logic does not turn ON the majority of the transistors (power-switches) in the power-gate circuit until the voltage VCCPG has ramped up close to a level of the ungated voltage supply (referred to herein as a voltage supply VCC).

Another feature of one embodiment of the power-gate circuit that does not use the additional delay cells is an extremely fast turn OFF time. As previously explained above for a conventional power-gate circuit, the additional delay cells slow down the turn OFF speed, thereby causing some power consumption before the supplied power is shut off or reduced. The absence of such additional delay cells in one embodiment enables a faster turn OFF time. This faster turn OFF time in turn results in energy savings each time the power-gate is switched to shut off or reduce the supplied power.

FIG. 1 illustrates a power-gate circuit 100 in accordance with one embodiment. The power-gate circuit 100 may have a plurality of circuit blocks such as shown in FIG. 1. Each of the circuit blocks may in turn have one or more electronic components therein that are coupled to the ungated voltage supply VCC.

A first block 102, labeled "rush current limiter," is configured in one embodiment to limit or reduce a magnitude, as well as rate of change, of an ON-rush current flowing to the gated voltage supply VCCPG from the ungated voltage supply VCC. The block 102 includes a field effect transistor or "FET" (such as a P-type or PFET transistor 104) coupled to a buffer 106 that receives an input signal pgenb. As will be explained in detail below with respect to FIG. 2 and elsewhere, the limiting effect on the magnitude of the ON-rush current may be provided by restricting a size (such as a width) of the PFET transistor 104 in this block 102 to a small width.

A block 108, labeled "chopper delay cell," of one embodiment is configured to delay both its outputs (shown as In_p and In_n) differently depending on if the input (received from the block 102) has a rising or falling transition. Delaying the outputs In_p and In_n is used in one embodiment to avoid any short circuit paths in a power-gate cell block 110.

One embodiment of the power-gate circuit 100 may have at least one block 110, which is labeled "power-gate cell" in FIG. 1. The block 110 is shown in detail in FIG. 1 and includes at least one transistor that will be explained in detail below, and a next power-gate cell block 112 coupled to the block 112 may have substantially the same components and configuration as the block 110. For the sake of simplicity, the details of the block 112 are not repeated in FIG. 1, since such details can be readily determined by examining the configuration in the block 110.

Multiple power-gate cells may be provided by daisy chaining outputs of each power-gate cell to the inputs of the next power-gate cell. For instance, the terminals that provide the output signals Out_p and Out_n may be coupled to the terminals that provide the input signals In_p and In_n to the next power-gate cell. The number of power-gate cells of one embodiment may be selected based on the size of the electronic component(s), power consumption specification, the type or size of circuit, etc. (shown generally in FIG. 1 as a load 114 coupled to the voltage supply VCCPG) to be power-gated. For simplicity, FIG. 1 shows the first power-gate cell block 110, and the next block 112 is shown to represent that one or more additional power-gate cells may be daisy chained or otherwise coupled to the first power-gate cell block 110.

In detail with respect to the block 108, the chopper delay cell of one embodiment includes one or more delay cells 116 having an input terminal coupled to receive the signal pgenb from the block 102. The delay cell(s) 116 has an output terminal coupled to a first input terminal of an AND gate 118 and coupled to a first input terminal of an OR gate 120. The block 102 also provides the signal pgenb to a second input terminal of the AND gate 118 and to a second input terminal of the OR gate 120. The delay cell(s) 116, the AND gate 118, and the OR gate 120 may be coupled to the voltage supply VCC to receive power.

With this configuration of the block 108, a rising edge of the signal pgenb (provided to the input terminal of the OR gate 120) immediately appears on the output terminal of the OR gate 120, and is delayed at the output terminal of the AND gate 118. Also with this configuration, a falling edge of the signal pgenb (provided to the input terminals of the OR gate 120 and the delay elements 116) is delayed at the output terminal of the OR gate 120 and at the output terminal of the AND gate 118.

The type of elements and the specific connections of the elements shown in the block 108 of FIG. 1 is only an example. Alternative/additional elements and/or other configurations of logic devices may be used in some other embodiments.

The block 108 is coupled to the block 110 of the power-gate cell. In one embodiment, an output terminal of the AND gate 118 is coupled to provide the signal In_p to an input terminal of an inverter 122. The inverter 122 has an output terminal coupled to provide a signal pgen_vcc to a control terminal of a transistor, which in one embodiment may be a gate terminal of a P-type MOSFET or "PFET" P2. In one embodiment, the PFET P2 has a source terminal coupled to the voltage supply VCC and has a drain terminal to provide a signal pgenb_pfet. In other embodiments, other types of transistor or electronic component may be used alternatively or additionally to a PFET or to a NFET described throughout this disclosure.

In one embodiment, the signal pgen_vcc may be provided to an input terminal of an inverter 124, which in turn has an output terminal that provides the output Out_p. The output terminal of the inverter 124, providing the output Out_p, may in turn be coupled to the next power-gate cell (block 122), such as by providing the output Out_p as an input In_p to an inverter of the next power-gate cell in a manner similar to that shown in the block 110.

In one embodiment, the block 110 includes another transistor, such as a PFET P1 having a control or gate terminal coupled to the drain terminal of the PFET P2 to receive the signal pgenb_pfet. The PFET P1 may have a source terminal coupled to the voltage supply VCC and a drain terminal coupled to the voltage supply VCCPG.

The OR gate 120 has an output terminal coupled to provide the signal In_n to an input terminal of an inverter 126, to an input terminal of a buffer 128, to a control terminal of a transistor (such as a gate terminal of a PFET P3), to a control terminal of another transistor (such as a gate terminal of a PFET P6), and to a control terminal of another transistor (such as a gate terminal of an N-type MOSFET or "NFET" N4). The inverter 126 has an output terminal coupled to provide a signal pgen_vccpg to a control terminal of a transistor (such as a gate terminal of a PFET P4) and to a control terminal of a transistor (such as a gate terminal of an NFET N3). The PFET P4 in turn has a drain terminal coupled to a control terminal of a transistor (such as a gate terminal of a PFET P5), such that the drain terminal of the transistor P4 and the gate terminal of the transistor P5 are coupled to the drain terminal of the PFET P2 that provides the signal pgenb_pfet and coupled to the gate terminal of the PFET P1.

The PFET P3 has a source terminal coupled to the voltage supply VCCPG and a drain terminal coupled to the source terminal of the PFET P4. The PFET P4 has its drain terminal coupled to a drain terminal of the NFET N3, which in turn has its source terminal coupled to ground.

The PFET P5 has a source terminal coupled to the voltage supply VCCPG and a drain terminal coupled to the source terminal of the PFET P6. The PFET P6 has its drain terminal coupled to a drain terminal of the NFET N4, which in turn has its source terminal coupled to ground. Furthermore in one embodiment, the drain terminal of the PFET P6 and the drain terminal of the NFET N4 are coupled to a control terminal of a transistor (such as a gate terminal of an NFET N2), such that a signal pden is provided to the gate terminal of the NFET N2. The NFET N2 in turn has a drain terminal coupled to the drain terminal of the PFET P2 that provides the signal pgenb_pfet and to the gate terminal of the PFET P1, and has a source terminal coupled to ground.

The buffer 128 has an output terminal that provides the output signal Out_n, which in turn may form an input signal In_n provided to an input terminal of the next power-gate cell in the block 112. The buffer 128 of one embodiment may receive power from the voltage supply VCC, while other elements (such as the inverter 126) may receive power from the voltage supply VCCPG, and the voltage supply VCCPG may in turn be coupled to other elements in the next power-gate cell in the block 112.

Figure 2:
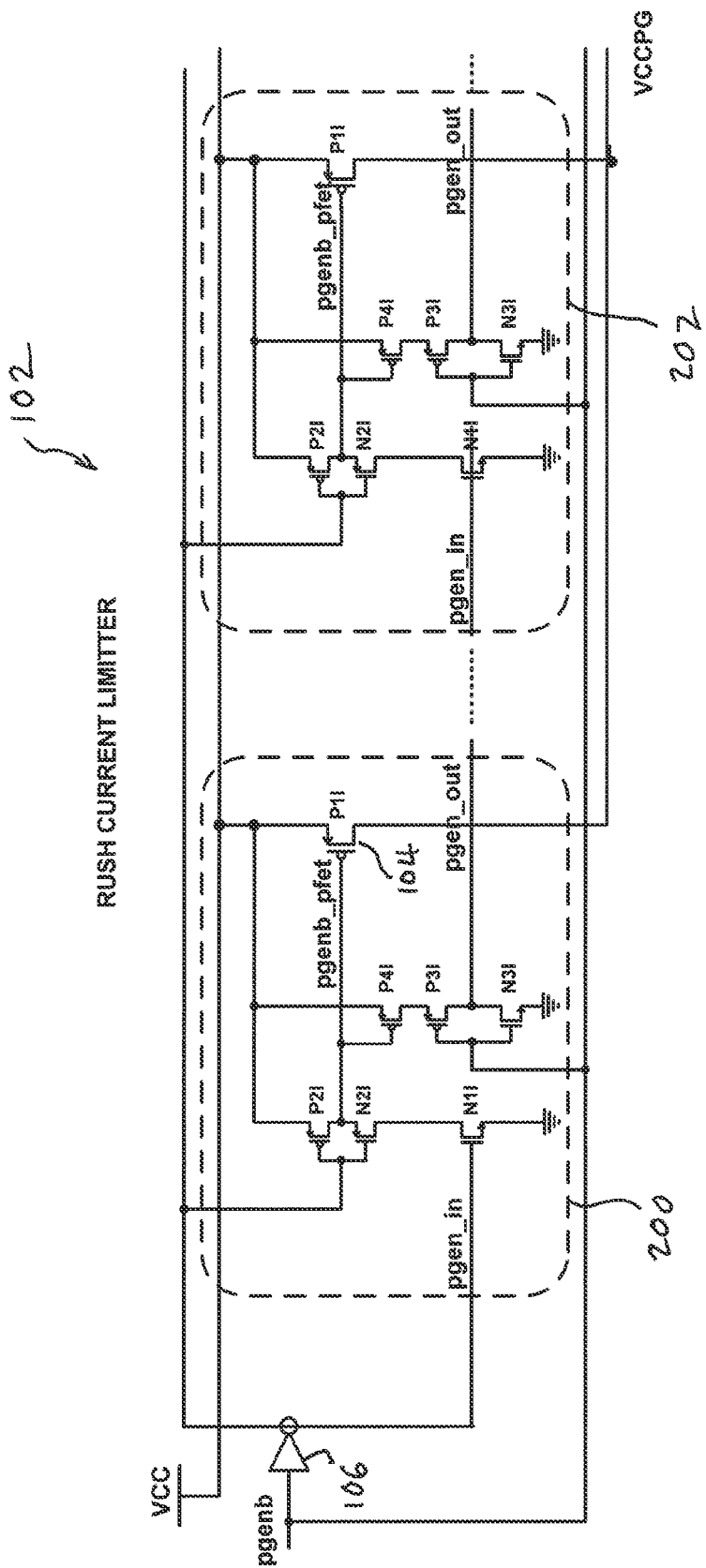
FIG. 2 illustrates in more detail an embodiment of a rush current limiter block of the power-gate circuit of FIG. 1.

FIG. 2 illustrates in more detail an embodiment of the rush current limiter in the block 102 of FIG. 1. The block 102 includes a sub-block 200, and may include one or more additional sub-blocks 202 that contain similar electronic components and configurations as the sub-block 200.

In one embodiment the buffer 106 (which receives the signal pgenb at its input terminal) has an output terminal coupled to provide a signal pgen_in to control terminals of various transistors, such as gate terminals of the PFET 2I, NFET 1I, and NFET 2I.

The PFET 2I has a source terminal coupled to the voltage supply VCC, and has a drain terminal coupled to the drain terminal of the NFET N2I. The drain terminal of the PFET 2I is further coupled to provide the signal pgenb_pfet to the gate terminal of the PFET 1I. The PFET 1I of FIG. 2 may be the same transistor as the PFET 104 shown in FIG. 1. The PFET 1I has a source terminal coupled to the voltage supply VCC, and has a drain terminal coupled to the voltage supply VCCPG. The source terminal of the NFET N2I is coupled to a drain terminal of the NFET N1I, which in turn has a source terminal coupled to ground.

In one embodiment, the sub-block 200 includes additional transistors, for example a PFET 4I, a PFET 3I, and an NFET N3I. The PFET 4I has a source terminal coupled to the voltage supply VCC, a gate terminal coupled to the drain terminal of the PFET 2I to receive the signal pgenb_pfet, and a drain terminal coupled to a source terminal of the PFET 3I. The PFET 3I in turn has a gate terminal coupled to receive the signal pgenb and a drain terminal coupled to a drain terminal of the NFET 3I.

The NFET 3I in turn has a gate terminal coupled to receive the signal pgenb, and a source terminal coupled to ground. A signal pgen_out is present at the node where the drain terminal of the NFET 3I is coupled to the drain terminal of the PFET 3I. The node having the signal pgen_out may be coupled to provide the signal pgen_in to the next sub-block 202.

Figure 3:
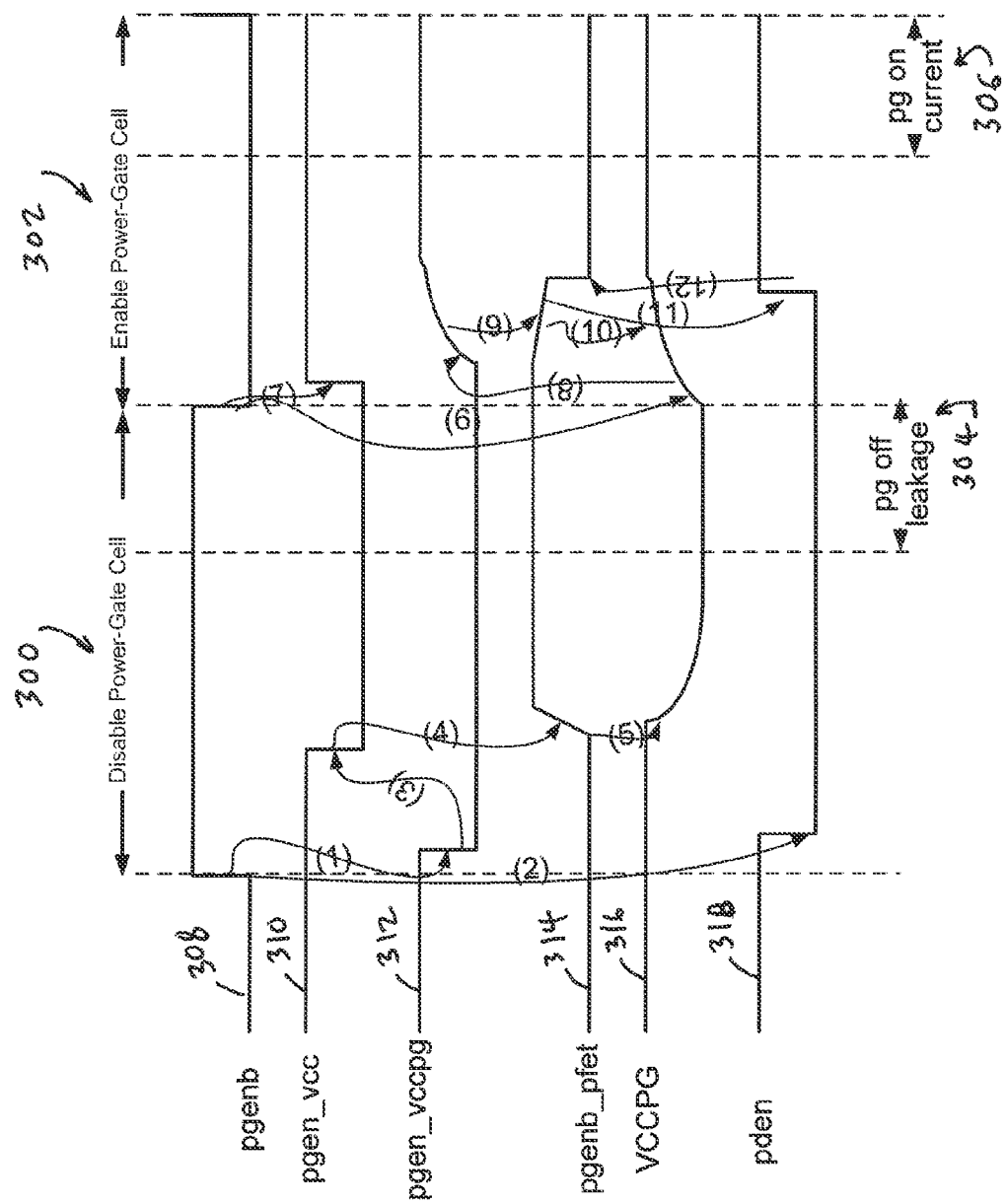
FIG. 3 are example waveform diagrams of various signals for the power-gate circuit of FIG. 1 in accordance with one embodiment.

FIG. 3 are example waveform diagrams of various signals (such as voltages or currents) for the power-gate circuit 100 of FIG. 1 in accordance with one embodiment. The timeframe depicted in FIG. 3 shows a period 300 wherein the power-gate cell (block 110) of FIG. 1 transitions to a first state (such as a disabled state) in which a lowered value of the voltage supply VCCPG is provided to the load 114. The timeframe depicted in FIG. 3 also shows a period 302 wherein the power-gate cell (block 110) of FIG. 1 transitions to a second state (such as an enabled state) in which a higher value (close to or equal to the voltage supply VCC) of the voltage supply VCCPG is provided to the load 114. A period 304 (when the power-gate cell is in the disabled state) represents a timeframe wherein the voltage supply VCCPG has reached a steady state value, and leakage current may be present. A period 306 (when the power-gate cell is in the enabled state) represents a timeframe during full operation wherein the voltage supply VCC may be provided to the electronic component(s) that are fully operating.

The waveforms shown in FIG. 3 include the signal pgenb (waveform 308), the signal pgen_vcc (waveform 310), the signal pgen_vccpg (waveform 312), the signal pgenb_pfet (waveform 314), the voltage supply VCCPG (waveform 316), and the signal pden (waveform 318).

Operation of one embodiment of the power-gate circuit 100 will now be described with reference to FIGS. 1, 2, and 3. The operation will be explained with respect to a disable sequence in which the power-gate circuit 100 enters an OFF state such that the voltage supply VCCPG is low, and with respect to an enable sequence in which the power-gate circuit 100 enters a different state (an ON state) such that the voltage supply VCCPG is high (for example, at a level close to or the same as the voltage supply VCC).

Beginning first with the disable (OFF state) sequence according to one embodiment, the disable sequence starts from an initial condition wherein the voltage supply VCCPG is high. When the signal pgenb transitions to a first/high logic level from a second/low logic level, the node where the signal pgen_vccpg appears and the node where the signal pden appears immediately fall low, as indicated by labels (1) and (2) in FIG. 3. These nodes falling low results in a turn OFF of the NFETs N3 and N2, which are pull-down devices inside the power-gate cell (block 110).

The signal pgen_vcc, however, is delayed by the chopper delay cell (block 108) before the signal pgen_vcc falls low as well, as indicated by the label (3) in FIG. 3. The signal pgen_vcc falling low results in a turn ON of the PFET P2, which is a pull-up device in the power-gate cell (block 110). The chopper delay cell in the block 108 of one embodiment prevents any short circuit or "crowbar" current in the power-gate cell (block 110) through the PFET P2 and the NFET N3 or through the PFET P2 and the NFET N2. As soon as the PFET P2 (which is a pull-up transistor) is turned ON in response to the signal pgen_vcc falling low, the node where the signal pgenb_pfet appears is pulled up, as indicated by the label (4) in FIG. 3, and the PFET power-gate cell(s) of blocks 110 and 112 are turned OFF immediately, for example since the PFET P1 is turned OFF. The level of the voltage supply VCCPG (at the node coupled to the load 114) leaks away or otherwise drops to a steady state value, as indicated by the label (5) in FIG. 3.

Turning now to the enable (ON state) sequence according to one embodiment, the signal pgenb transitions from high to low. The PFET 104 of FIG. 1 (also shown as the PFET P1I in FIG. 2) in the rush current limiter in the block 102 is now turned ON and starts charging up the voltage supply VCCPG, as indicated by the label (6) in FIG. 3. The operation of the rush current limiter is described later below. The amount of current drawn by the load 114 in one embodiment is dependent on the width of the PFET P1I in the rush current limiter. Accordingly, circuit designers can control the charging rate at the node on which the voltage supply VCCPG appears, by altering the width of the PFET P1I to be small in size, such as a smaller width than a width of the larger PFET P1 in the block 110. In one embodiment, if the capacity of the load 114 cannot be estimated accurately, the PFET P1I in the rush current limiter can be divided into several legs that are turned ON or OFF based on a programmable fuse configuration or other technique.

When the input signal pgenb falls to low, the chopper delay cell in the block 108 transitions the signal pgen_vcc signal from low to high, as indicated by the label (7) in FIG. 3, thereby turning OFF the pull-up PFET P2 inside the power-gate cell in the block 110. Now the remaining PFETs (such as the PFET P1) in the power-gate cell will be turned ON when the pull-down NFET N2 is fully ON. Specifically, the node on which the signal pgen_vccpg appears is driven by the inverter 126 that is powered by the voltage supply VCCPG. Since the input to this inverter 126 is low, the pgen_vccpg node follows the voltage supply VCCPG and is pulled up slowly as the voltage supply VCCPG ramps up, as indicated by the label (8) in FIG. 3. This means that the NFET N3 (which is a pull-down transistor) will not fully turn ON (e.g., activation of the NFET N3 is not completed) until after the rush current limiter circuit has sufficiently charged up the voltage supply VCCPG to at or near a level of the voltage supply VCC. This pull-down NFET N3 ensures that the PFET P1 does not turn ON too soon so as to result in high ON-rush currents.

When the pull-down NFET N3 starts turning ON, the NFET N3 starts to pull low the node at which the signal pgenb_pfet appears, such as indicated at the label (9) in FIG. 3. This slowly turns ON the PFET P1, which also aids in ramping up the voltage supply VCCPG, such as indicated by the label (10) in FIG. 3. In one embodiment, the size (such as the width) of the NFET N3 is extremely small so that the PFET P1 does not turn ON too soon to cause high ON-rush current. As the node at which the signal pgenb_pfet appears is pulled down to a sufficiently low level to turn ON the PFET P1, the PFET P5 turns ON, thereby in turn pulling up the signal pden to the level of the voltage supply VCCPG, such as indicated by the label (11) in FIG. 3. By this time the voltage supply VCCPG has reached a level that is very close to the level of the voltage supply VCC.

Finally, with the signal pden being high in response to the PFET P5 turning ON, the NFET N2 turns ON. This turning ON of the NFET N2 strongly pulls down the node in which the signal pgenb_pfet appears, such as indicated by the label (12) in FIG. 3, thereby turning the power-gate circuit 100 completely ON by completing the turning ON of the PFET P1 to place the voltage supply VCCPG at or near the voltage supply VCC.

In one embodiment, the rush current limiter circuit (shown in detail in FIG. 2) not only regulates the peak level of the ON-rush current drawn during the turn ON sequence, but also regulates the Ldidt (which is a slope of the ON-rush current) during turn ON. Ldidt should be low so that there is minimal disturbance on the voltage supply VCC when the power-gate circuit 100 turns ON. The peak of the ON-rush current is controlled by choosing an appropriate size (such as a width) of the PFET P1I.

The NFET N1I and NFET N2I discharge the node pgenb_pfet at a slow rate, which means the PFET P1I turns ON at a slow rate, thereby contributing to a low Ldidt. The widths of the NFET N1I and NFET N2I control the Ldidt during the turn ON sequence of the power-gate circuit 100. The rush current limiter of one embodiment may also be split up into a series of daisy chained cells to slow down the Ldidt even further, such as shown by the sub-block 202 coupled to the sub-block 200 in FIG. 2. The signal pgenb (inverted to a high level) is supplied in parallel to all these cells to turn OFF the PFET P2I in parallel during the turn ON sequence of the power-gate circuit 100. The PFET P1I is turned ON one cell after the other (as a result of the NFETs N2I and N1I being turned ON to pull down the node at the gate of the PFET P1I), thereby resulting in low Ldidt. Thus, Ldidt during the turn ON sequence may be controlled in one embodiment by using a narrow-width NFET N1I and/or by the number of daisy chained sub-blocks 200, 202, etc.

Furthermore, Vdroop (which is the maximum droop on the voltage supply VCC when the power-gate circuit 100 is turned ON) is able to be kept lower. A lower Vdroop will keep the voltage supply VCC less bouncy and noisy.

During the turn OFF sequence of the power-gate circuit 100, the signal pgenb turns OFF all the sub-block(s) 200, 202, etc. in parallel and propagates to the rest of the power-gate circuit 100.

The following describes some additional features of various embodiments:

During the turn ON sequence, while the voltage supply VCCPG is ramping up, the pgenb_pfet node may be in a high impedance state for a while between the time periods indicated by the labels (7) and (9) in FIG. 3. During this time period indicated by the label (8), the node at which the voltage supply VCCPG appears, couples onto the node at which the signal pgenb_pfet appears, possibly causing an overshoot. This overshoot may be prevented or otherwise reduced by using the PFET P4. This PFET P4 transfers the charge coupling onto the node of the signal pgenb_pfet back to the voltage supply VCCPG through the PFET P3.

The NFET N3 and the PFET P3 may be sized to be small, so as prevent or otherwise reduce high ON-rush current.

The chopper delay, between the nodes of the signals pgen_vcc and pgen_vccpg, may be made sufficiently large in order to prevent or otherwise reduce a crowbar current through the PFET P2 and the NFET N2 and through the PFET P2 and the NFET N3.

In a conventional approach, the additional delay elements are overdesigned with a sufficient delay margin so as to prevent high ON-rush current. In comparison, one embodiment enables the delay during turn ON to be dynamically dependent on the ON-rush current limit that is set by the designer. This is because the logic operating on the voltage supply VCCPG in FIG. 1 may be dynamically turned ON only after the voltage supply VCCPG ramps up, thereby precluding the need to design with margins and thus optimizing the turn ON time without delay overhead.

Accordingly from the above description, it can be seen that the ON-rush current may be controlled by an appropriate selection of the width of the PFET P1I to be of a sufficiently small/narrow size. Since the ON-rush current may be controlled by PFET-width only in one embodiment, the ON-rush current is easier to control. In contrast in a conventional approach, controlling the ON-rush current additionally depends on providing a number of additional delay elements, which results in more area and power consumption.

Furthermore, power consumption in both standby state and active state is reduced in one embodiment by not using such additional delay cells. For example, during turn OFF, one embodiment has fewer cells/elements coupled to the always-ON voltage supply VCC due to the absence of additional delay elements/cells, thereby resulting in lesser power consumption in the standby state and/or in a full operating state.

Also as evident from the description above, during the turn ON sequence, the delay used in ramping up the voltage supply VCCPG with low ON-rush current, is generated by applying logic on/to the voltage supply VCCPG itself. This logic is described above and shown in FIGS. 1-3, in which signals are delayed so that the majority of the PFETs are kept deactivated by not turning ON such transistors while the voltage supply VCCPG is increasing and until the voltage supply VCCPG has ramped up close to the voltage supply VCC.

Furthermore in one embodiment that does not use the additional delay elements of the conventional approach, there is an extremely fast turn OFF time that can be achieved, such as shown and described above. In the conventional approach, the additional delay cells slow down the turn OFF speed, whereas the absence of such additional delay cells in one embodiment enables a faster turn OFF speed that is orders of magnitude faster. This fast turn OFF results in power savings every time the power-gate circuit 100 is switched OFF.

Some variations to the embodiments described above are possible. For example, the PFETs P3 and P4 can be removed in one embodiment. A possible side effect of this removal is an overshoot on the node where the signal pgenb_pfet appears. If the magnitude of the overshoot is tolerable, then the PFETs P3 and P4 can be removed.

As another example, the NFET N2, the NFET N4, the PFET P5, and the PFET P6 can be removed in one embodiment. These transistors are present so that the node at which the signal pgenb_pfet appears has a strong pull to ground once the power-gate circuit 100 is fully ON. If a weak pull of such node of the signal pgenb_pfet to ground by the NFET N3 is sufficient, then one or more of the NFET N2, the NFET N4, the PFET P5, and the PFET P6 can be left out.

As still another example, the inverter 122 that drives the signal pgen_vccpg can be built in a special way in one embodiment. For example, a PFET in this inverter 122 can be replaced with an NFET. This modification results in the node of the signal pgen_vccpg having a value of VCCPG-VT (wherein VT is the threshold voltage of the NFET), during turn ON. This adds more delay margin to prevent high ON rush current before the NFET N3 turns ON.

Figure 4:
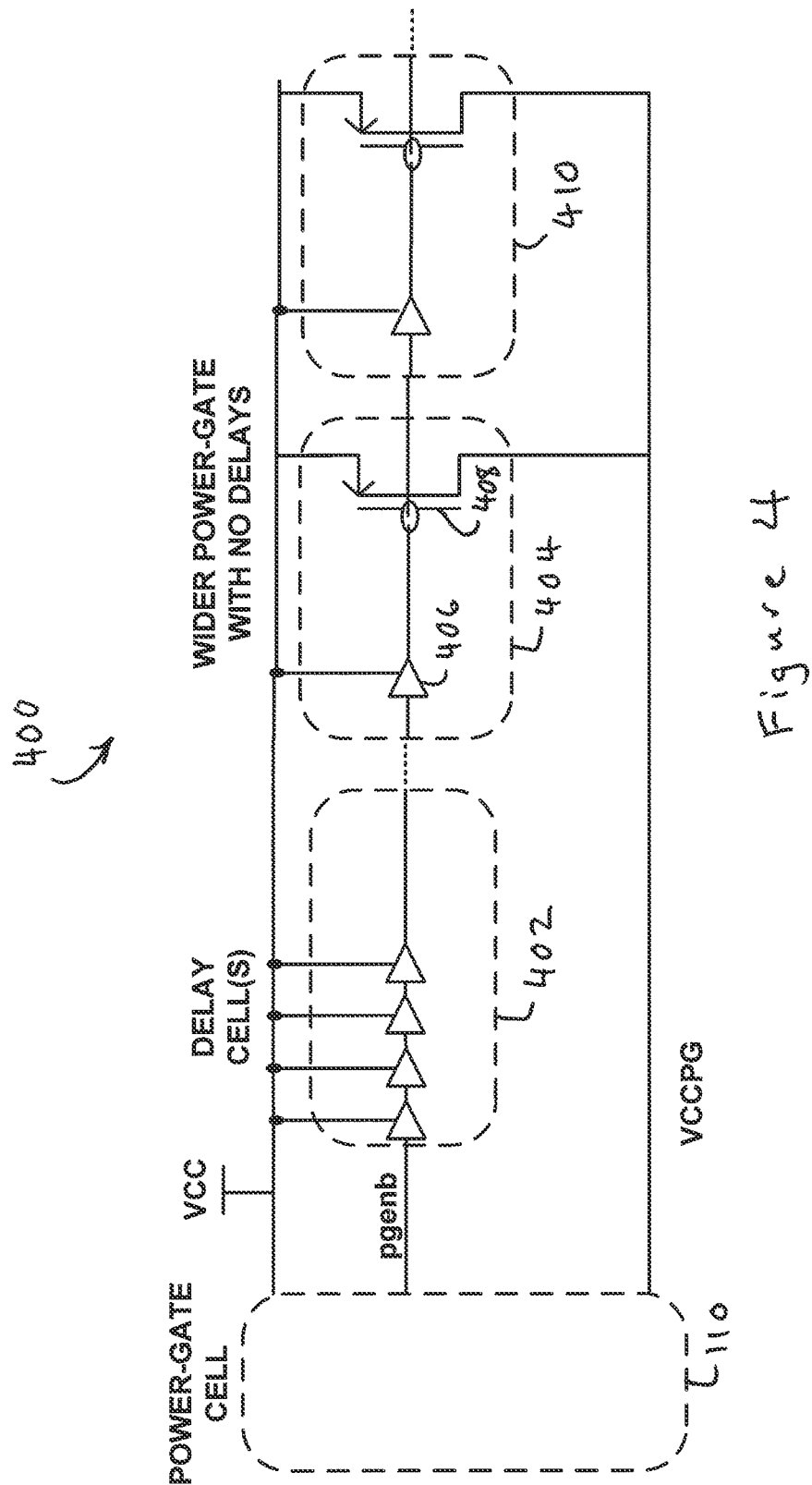
FIG. 4 illustrates a circuit that may be used in conjunction with the power-gate circuit of FIG. 1 in accordance with another embodiment.

As still yet another example, the power-gate cells of FIG. 1 need not be repeated in a daisy chain configuration in which these cells are a coupled to each other in series. For instance, instead of a daisy chain configuration as described above, FIG. 4 illustrates a circuit 400 that may be used in conjunction with the power-gate circuit 100 of FIG. 1 in accordance with another embodiment. In FIG. 4, a single power-gate cell of block 110 is coupled to and followed downstream by at least one delay cell 402 having one or more delay elements that receive the signal pgenb. The delay cell(s) 402 is then followed downstream by daisy chaining one or more power-gate cells 404, 410, etc. that have no delay elements. The power-gate cells 404, 410, etc. may each include an inverter 406 having an input terminal coupled to receive the delayed pgenb signal and powered by the voltage supply VCC, and having an output terminal coupled to a gate terminal of a PFET 408. The PFET 408 in turn has a source coupled to the voltage supply VCC and a drain coupled to the voltage supply VCCPG. The PFET 408 can be designed to be of larger size, such as an increased width that is larger than a width of the PFET P1.

Embodiments of the power-gate circuits described herein may be used in a number of implementations and applications. For example, mobile devices, including but not limited to smart phones, nettops, tablets and other Mobile Internet Devices (MIDs), are designed with low-power circuitry. Also, microprocessors have low power states that may use power-gate techniques to prevent certain circuits or elements thereof from unnecessarily consuming power. FIG. 5 is a block diagram that illustrates an example computer system 500 suitable to practice the disclosed power-gate circuit/method of various embodiments.

As shown, the computer system 500 may include a power supply unit 502, a number of processors or processor cores 504, a system memory 506 having processor-readable and processor-executable instructions 508 stored therein, a mass storage device 510 that may also store the instructions 508, and a communication interface 512. For the purpose of this application, including the claims, the terms "processor" and "processor cores" may be considered synonymous, unless the context clearly requires otherwise.

In various embodiments of the present disclosure, at least one of the processors 504 may generate or cause to be generated the signal pgenb having high or low states, in response to the particular state of the computer system 100, such as whether one or more circuits or elements thereof are to be placed in standby state.

The one or more mass storage devices 510 and/or the memory 506 may comprise a tangible, non-transitory computer-readable storage device (such as a diskette, hard drive, compact disc read only memory (CDROM), hardware storage unit, and so forth). The computer system 500 may also comprise input/output devices 514 (such as a keyboard, display screen, cursor control, and so forth). In various embodiments an purely by way of example, the I/O devices 514 may include electronic component(s) 518 (such as the load 114 of FIG. 1) that are to be power-gated and/or may itself comprise the power-gate circuit 100 and others described above. Such component(s) 518 may alternatively or additionally be located elsewhere in the computer system 500, and may comprise part or all of an integrated circuit. The load 114 of FIG. 1 may also be one of the processor cores 504 that is getting power gated The various elements of FIG. 5 may be coupled to each other via a system bus 516, which represents one or more buses. In the case of multiple buses, they may be bridged by one or more bus bridges (not shown). Data may pass through the system bus 516 through the I/O devices 514, for example, between the component(s) 518 and the processors 504.

The system memory 506 and the mass storage device 510 may be employed to store a working copy and a permanent copy of the programming instructions implementing one or more operating systems, firmware modules or drivers, applications, and so forth, herein collectively denoted as 508. The permanent copy of the programming instructions may be placed into permanent storage in the factory, or in the field, through, for example, a distribution medium (not shown), such as a compact disc (CD), or through the communication interface 512 (from a distribution server (not shown)).

The remaining constitution of the various elements of the computer system 500 is known, and accordingly will not be further described in detail.

The above description of illustrated embodiments, including what is described in the Abstract, is not intended to be exhaustive or to be limited to the precise forms disclosed. While specific embodiments and examples are described herein for illustrative purposes, various modifications are possible. For example, the configuration and connection of certain elements in various embodiments have been described above in the context of high/low values of signals, responses to rising/falling edges of signals, inverters to invert signals, P-type and N-type transistors, and so forth. In other embodiments, different configurations can be provided in view of whether N-type transistors are used instead of P-type transistors, whether or not certain signals are inverted, whether certain changes in state are triggered in response to falling edges instead of rising edges or vice versa, and so forth.

These and other modifications can be made in light of the above detailed description. The terms used in the following claims should not be construed to be limited to the specific embodiments disclosed in the specification.

What is claimed is:

1. An apparatus, comprising:
a first power-gate cell having at least one transistor, and configured to transition to a first state in which a voltage supply is controlled by the first power gate cell to have a first level and configured to transition to a second state in which the voltage supply is controlled by the first power-gate cell to have a second level that is higher than the first level;
a current limiter cell coupled to the first power gate cell and configured to reduce a magnitude and rate of change of a current during the transition to the second state;
a delay cell coupled to the first power-gate cell and to the current limiter cell, and configured to remove a short circuit path in the first power-gate cell during the transition to the first state;
at least one delay element coupled downstream of said first power-gate cell; and
a second power-gate cell coupled downstream of said at least one delay element, said second power-gate cell having no delay element and having a transistor with a size that is larger than a size of said at least one transistor of the first power-gate cell, wherein the transistor of said second power-gate cell is configured to transition the voltage supply to the first and second levels;

wherein the first power-gate cell includes logic configured to delay an increase of the voltage supply to the second level and to maintain said at least one transistor deactivated while the voltage supply increases to the second level.

2. The apparatus of claim 1 wherein to said reduce the magnitude of the current during the transition to the second state, the current limiter cell includes and is configured to operate a transistor having a size that is smaller than a size of said at least one transistor of the first power-gate cell.

3. The apparatus of claim 1, wherein the apparatus includes a number of power-gate cells including the first and second power-gate cells, and wherein the number of power-gate cells is selected based on a size and power consumption specification of an electronic component to receive the voltage supply.

4. The apparatus of claim 1 wherein the first power gate cell is configured to receive an input signal, and wherein logic of the first power-gate cell includes:
a pull-up transistor coupled to said at least one transistor and configured to activate in response to a first logic level of the input signal so as to deactivate said at least one transistor during the transition to the first state; and
a pull-down transistor coupled to the pull-up transistor and to said at least one transistor,
wherein the pull-up transistor is configured to deactivate in response to a second logic level of the input signal so as to start to activate the pull-down transistor during the transition to the second state, and
wherein activation of the pull-down transistor is not completed, so as to said maintain said at least one transistor deactivated while the voltage supply increases to the second level during the second state, until after the voltage supply reaches the second level.

5. The apparatus of claim 4 wherein said at least one transistor includes:
a first transistor that is said maintained deactivated while the voltage supply increases to the second level during the second state and is activated as the second level is reached;
a second transistor coupled to the first transistor and configured to activate as the first transistor activates; and
a third transistor configured to activate in response to activation of the second transistor so as to complete activation of the first transistor to place the voltage supply at the second level.

6. The apparatus of claim 1 wherein the first power-gate cell is configured to have increased speed to transition to the first state so as to reduce power consumption during the transition to the first state, and wherein the first power-gate cell is absent of additional delay cells so as to reduce power consumption while in the first state or in the second state.

7. A method, comprising:
transitioning a power-gate cell having at least one transistor to a disable state in which a voltage supply is controlled by the power gate cell to have a lowered value;
transitioning the power-gate cell to an enable state in which the voltage supply is controlled by the power-gate cell to have a higher value than the lowered value;
reducing a magnitude of a current during the transition to the enable state; and
removing a short circuit path in the power-gate cell during the transition to the disable state,
wherein said transitioning to the enable state includes using logic in the power-gate cell to delay an increase of the voltage supply to the higher value and to maintain said at least one transistor deactivated while the voltage supply increases to the higher value, and wherein said transitioning to the enable state includes:
maintaining a first transistor of the power-gate cell deactivated while the voltage supply increases to the higher value during the second state and is configured to activate as the higher value is reached;
activating a second transistor of the power-gate cell as the first transistor activates; and
activating a third transistor of the power-gate cell in response to activation of the second transistor to complete activation of the first transistor to place the voltage supply at the higher value.

8. The method of claim 7 wherein said reducing the magnitude of the current during the transition to the enable state includes operating a transistor having a size that is smaller than a size of said at least one transistor.

9. The method of claim 7, further comprising:
increasing speed to transition to the disable state so as to reduce power consumption during the transition to the disable state, and
reducing power consumption while in the disable state or in the enable state by not powering additional delay cells.

10. The method of claim 7, further comprising:
receiving an input signal having a first logic level or a second logic level;
activating a pull-up transistor in response to the first logic level of the input signal so as to deactivate said at least one transistor during the transition to the disable state;
deactivating a pull-down transistor in response to the second logic level of the input signal so as to start to activate the pull-down transistor during the transition to the enable state,
wherein activation of the pull-down transistor is not completed, so as to said maintain said at least one transistor deactivated while the voltage supply increases to the higher value during the enable state, until after the voltage supply reaches the higher value.

11. A system, comprising:
a load;
a power-gate cell coupled to the load and having at least one transistor, the power-gate cell being configured to transition to a first state in which a voltage supply to the load is controlled by the power gate cell to have a first level and configured to transition to a second state in which the voltage supply to the load is controlled by the power-gate cell to have a second level that is higher than the first level and that is approximately equal to a full operating level; and
a current limiter cell coupled to the power gate cell and configured to reduce a magnitude of a current during the transition to the second state,
wherein the power-gate cell includes logic configured to delay an increase of the voltage supply to the second level and to maintain said at least one transistor deactivated while the voltage supply increases to the second level, and
wherein said at least one transistor of the power-gate cell includes:
a first transistor that is configured to be deactivated while the voltage supply increases to the second level during the second state and is configured to activate as the second level is reached;
a second transistor coupled to the first transistor and configured to activate as the first transistor activates; and
a third transistor configured to activate in response to activation of the second transistor so as to complete activation of the first transistor to place the voltage supply at the second level.

12. The system of claim 11 wherein the load includes an electronic component of a mobile device.

13. The system of claim 11 wherein the load includes a portion of an integrated circuit.

14. The system of claim 11 wherein to said reduce the magnitude of the current during the transition to the second state, the current limiter cell includes and is configured to operate a transistor having a size that is smaller than a size of said at least one transistor of the power-gate cell.

15. The system of claim 11 wherein the power gate cell is configured to receive an input signal, and wherein logic of the power-gate cell includes:
  a pull-up transistor coupled to said at least one transistor and configured to activate in response to a first logic level of the input signal so as to deactivate said at least one transistor during the transition to the first state; and
  a pull-down transistor coupled to the pull-up transistor and to said at least one transistor,
  wherein the pull-up transistor is configured to deactivate in response to a second logic level of the input signal so as to start to activate the pull-down transistor during the transition to the second state, and
  wherein activation of the pull-down transistor is not completed, so as to said maintain said at least one transistor deactivated while the voltage supply increases to the second level during the second state, until after the voltage supply reaches the second level.

16. The system of claim 11, further comprising a delay cell coupled to the power-gate cell and to the current limiter cell, and configured to remove a short circuit path in the power-gate cell during the transition to the first state.

* * * * *